(12) United States Patent
Miura et al.

(10) Patent No.: US 12,308,606 B2
(45) Date of Patent: May 20, 2025

(54) LIGHT EMITTING DEVICE

(71) Applicant: NICHIA CORPORATION, Anan (JP)

(72) Inventors: Soichiro Miura, Tokushima (JP); Ryota Okuno, Tokushima (JP)

(73) Assignee: NICHIA CORPORATION, Anan (JP)

( * ) Notice: Subject to any disclaimer, the term of this patent is extended or adjusted under 35 U.S.C. 154(b) by 0 days.

(21) Appl. No.: 18/600,738

(22) Filed: Mar. 10, 2024

(65) Prior Publication Data

US 2024/0213739 A1    Jun. 27, 2024

Related U.S. Application Data

(63) Continuation of application No. 17/942,922, filed on Sep. 12, 2022, now Pat. No. 11,984,698, which is a
(Continued)

(30) Foreign Application Priority Data

Jan. 22, 2019    (JP) .................. 2019-008494

(51) Int. Cl.
*H01S 5/02345* (2021.01)
*H01S 5/00* (2006.01)
(Continued)

(52) U.S. Cl.
CPC ........ *H01S 5/02345* (2021.01); *H01S 5/0071* (2013.01); *H01S 5/02255* (2021.01);
(Continued)

(58) Field of Classification Search
CPC .............. H01S 5/02345; H01S 5/0071; H01S 5/02255; H01S 5/023; H01S 5/02315; H01S 5/0233; H01S 5/0425; H01S 5/4025
See application file for complete search history.

(56) References Cited

U.S. PATENT DOCUMENTS

2002/0149314 A1    10/2002  Takahashi et al.
2010/0302775 A1    12/2010  Hata
(Continued)

FOREIGN PATENT DOCUMENTS

JP    2010278098 A    12/2010
JP    2011-023557 A    2/2011
(Continued)

*Primary Examiner* — Yuanda Zhang
(74) *Attorney, Agent, or Firm* — Global IP Counselors, LLP

(57) ABSTRACT

A light emitting device includes a base, a frame, first and second semiconductor laser elements, one or more light-reflective members, and wires. The frame part has first inner lateral surfaces, second inner lateral surfaces, a first and second step-parts respectively formed along the second inner lateral surfaces. The wires are bonded to an upper surface of the first step-part or an upper surface of the second step-part. The first semiconductor laser element is disposed closer to the first step-part. The second semiconductor laser element is disposed closer to the second step-part. All of the wires that electrically connect the first semiconductor laser element to the frame part are not bonded to the upper surface of the second step-part. All of the wires that electrically connect the second semiconductor laser element to the frame part are not bonded to the upper surface of the first step-part.

19 Claims, 7 Drawing Sheets

Related U.S. Application Data continuation of application No. 16/748,246, filed on Jan. 21, 2020, now Pat. No. 11,476,638.

(51) Int. Cl.

| | |
|---|---|
| *H01S 5/02255* | (2021.01) |
| *H01S 5/023* | (2021.01) |
| *H01S 5/02315* | (2021.01) |
| *H01S 5/0233* | (2021.01) |
| *H01S 5/042* | (2006.01) |
| *H01S 5/40* | (2006.01) |

(52) U.S. Cl.
CPC .......... *H01S 5/023* (2021.01); *H01S 5/02315* (2021.01); *H01S 5/0233* (2021.01); *H01S 5/0425* (2013.01); *H01S 5/4025* (2013.01)

(56) References Cited

U.S. PATENT DOCUMENTS

| | | |
|---|---|---|
| 2011/0012151 A1 | 1/2011 | Ono |
| 2011/0206079 A1 | 8/2011 | Hsieh et al. |
| 2011/0220927 A1 | 9/2011 | Min |
| 2012/0091500 A1 | 4/2012 | Matoba et al. |
| 2012/0267671 A1 | 10/2012 | Jung et al. |
| 2013/0265561 A1 | 10/2013 | Takahira et al. |
| 2015/0255949 A1 | 9/2015 | Lee et al. |
| 2016/0285234 A1 | 9/2016 | Okahisa |
| 2017/0122505 A1 | 5/2017 | Kiyota et al. |
| 2017/0237227 A1 | 8/2017 | Fujimoto |
| 2018/0097335 A1 | 4/2018 | Breidenassel et al. |
| 2019/0245117 A1 | 8/2019 | Kim et al. |
| 2020/0036158 A1* | 1/2020 | Miyata ................ H01S 5/06825 |

FOREIGN PATENT DOCUMENTS

| | | |
|---|---|---|
| JP | 2011-138953 A | 7/2011 |
| JP | 2011204983 A | 10/2011 |
| JP | 2011-254080 A | 12/2011 |
| JP | 2012-227511 A | 11/2012 |
| JP | 2015228401 A | 12/2015 |
| JP | 2016-184729 A | 10/2016 |
| JP | 2017085036 A | 5/2017 |
| JP | 2017-147301 A | 8/2017 |
| JP | 2018-512745 A | 5/2018 |
| JP | 2018-516452 A | 6/2018 |
| WO | 2011/013581 A1 | 2/2011 |
| WO | 2016/160704 A1 | 10/2016 |

* cited by examiner

LIGHT EMITTING DEVICE

CROSS-REFERENCE TO RELATED APPLICATIONS

This application is a continuation application of U.S. patent application Ser. No. 17/942,922, filed on Sep. 12, 2022, which is a continuation application of U.S. patent application Ser. No. 16/748,246, filed on Jan. 21, 2020, now U.S. Pat. No. 11,476,638. This application claims priority to Japanese Patent Application No. 2019-008494 filed on Jan. 22, 2019. The entire disclosures of U.S. patent application Ser. No. 17/942,922 and Ser. No. 16/748,246 and Japanese Patent Application No. 2019-008494 are hereby incorporated herein by reference.

BACKGROUND

1. Technical Field

The present disclosure relates to a light emitting device.

2. Description of Related Art

Japanese published unexamined application No. 2011-254080 discloses a light emitting element package which includes a bottom part where a light emitting element is disposed, and a step provided at the periphery of the light emitting element. No. 2011-254080 also discloses that a bonding region is provided at the upper surface of the step, and a wire is bonded to the bonding region and to the light emitting element to electrically connect them. Japanese published unexamined application No. 2011-254080 also discloses that a Zener diode is provided at the upper surface of the step. In the light emitting element package, one cavity is provided for each light emitting element. Therefore, the size of the bonding region increases proportionally to the number of the light emitting elements.

There is still susceptible to improvement of the wiring pattern in a light emitting device including a plurality of light emitting elements.

SUMMARY

The present disclosure includes the following aspects.

A light emitting device includes a base, a frame, a plurality of semiconductor laser elements, one or more light-reflective members, and a plurality of wires. The base has a bottom surface. The frame part has a pair of first inner lateral surfaces facing each other with the bottom surface being disposed therebetween in a first direction, a pair of second inner lateral surfaces facing each other with the bottom surface being disposed therebetween in a second direction, a first step-part formed along one of the pair of second inner lateral surfaces, and a second step-part formed along the other of the pair of second inner lateral surfaces. The semiconductor laser elements are disposed on the bottom surface and configured to emit laser lights that travel toward one of the first inner lateral surfaces. The semiconductor laser elements include a first semiconductor laser element and a second semiconductor laser element. One or more light-reflective members are disposed on the bottom surface, and configured to reflect the laser lights emitted from the plurality of semiconductor laser elements. The wires are respectively bonded to an upper surface of the first step-part or an upper surface of the second step-part to electrically connect the plurality of semiconductor laser elements to the frame part. The first semiconductor laser element is disposed closer to the first step-part than the second semiconductor laser element. The second semiconductor laser element is disposed closer to the second step-part than the first semiconductor laser element. All of the wires that electrically connect the first semiconductor laser element to the frame part are not bonded to the upper surface of the second step-part. All of the wires that electrically connect the second semiconductor laser element to the frame part are not bonded to the upper surface of the first step-part.

The present disclosure realizes, in a light emitting device including a plurality of light emitting elements disposed at one surface, a suitable wiring pattern electrically connected to the plurality of light emitting elements.

DETAILED DESCRIPTION OF EMBODIMENTS

Figure 1:
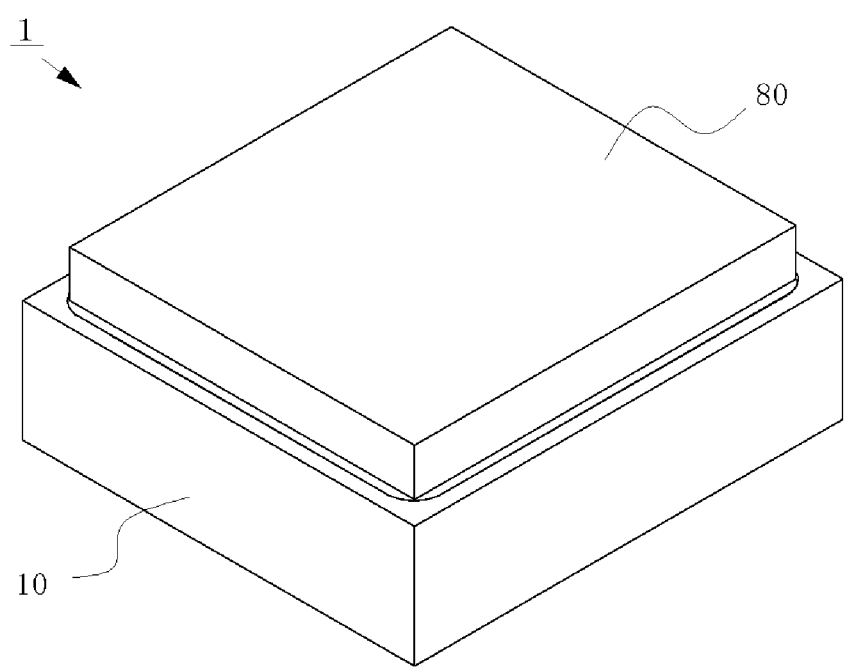
FIG. 1 is a perspective view of a light emitting device according to a first embodiment.

In the description and the claims, the terms referring to any polygon such as a triangle, a quadrangle and the like include polygons having their corners (ends of sides) rounded, chamfered, beveled, or bowed. Similarly, any polygon having its side or sides deformed at an intermediate portion or intermediate portions is also referred to as a polygon. That is, any shape obtained by deforming a polygon is construed as "a polygon" recited in the description and the claims.

Without being limited to polygons, the same holds true for terms referring to a particular shape such as a trapezoid, a circle, or a recess or a projection. The foregoing also applies to each side forming such a shape. That is, a side which is deformed at its end or intermediate portion is still construed as "a side". Note that, "a polygon" or "a side" without any intended deformation is referred to with the term "exact", such as "an exact quadrangle", when distinguished from any intentionally deformed shape.

In the following, with reference to the drawings, a description will be given of an embodiment for carrying out the present disclosure. While the embodiment embodies the technical idea of the present disclosure, it is not intended to limit the present disclosure. In the following description, identical names and reference characters are allotted to identical or similar members, and any repetitive description may be avoided as appropriate. The size or positional relationship of members in the drawings may be exaggerated for the sake of clarity.

First Embodiment

Figure 2:
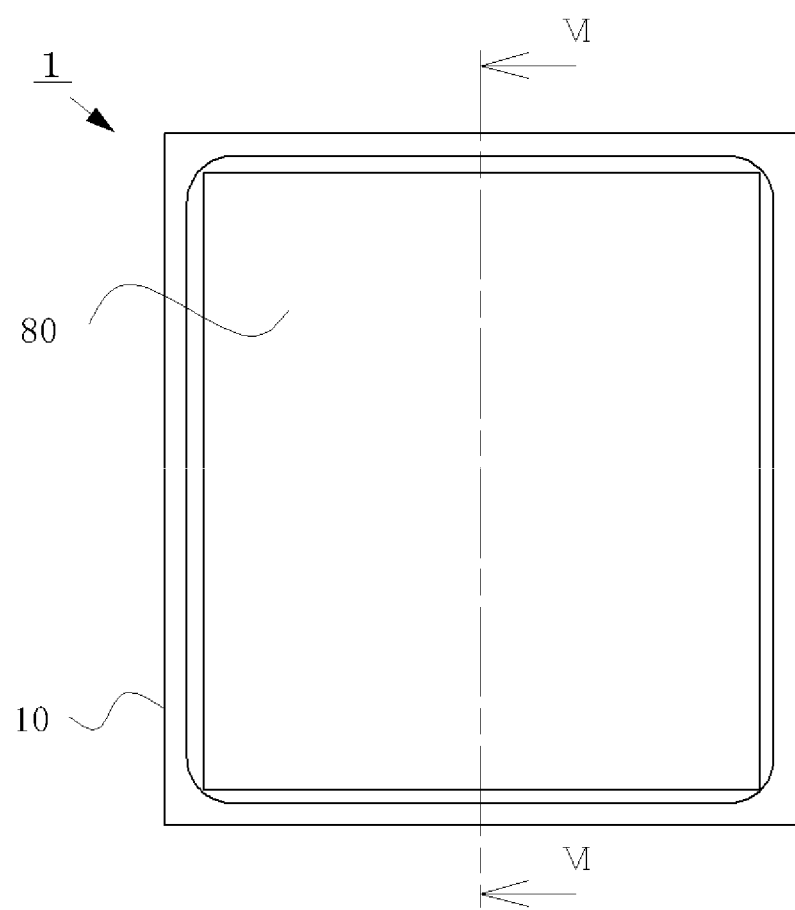
FIG. 2 is a top view of the light emitting device according to the first embodiment.
Figure 3:
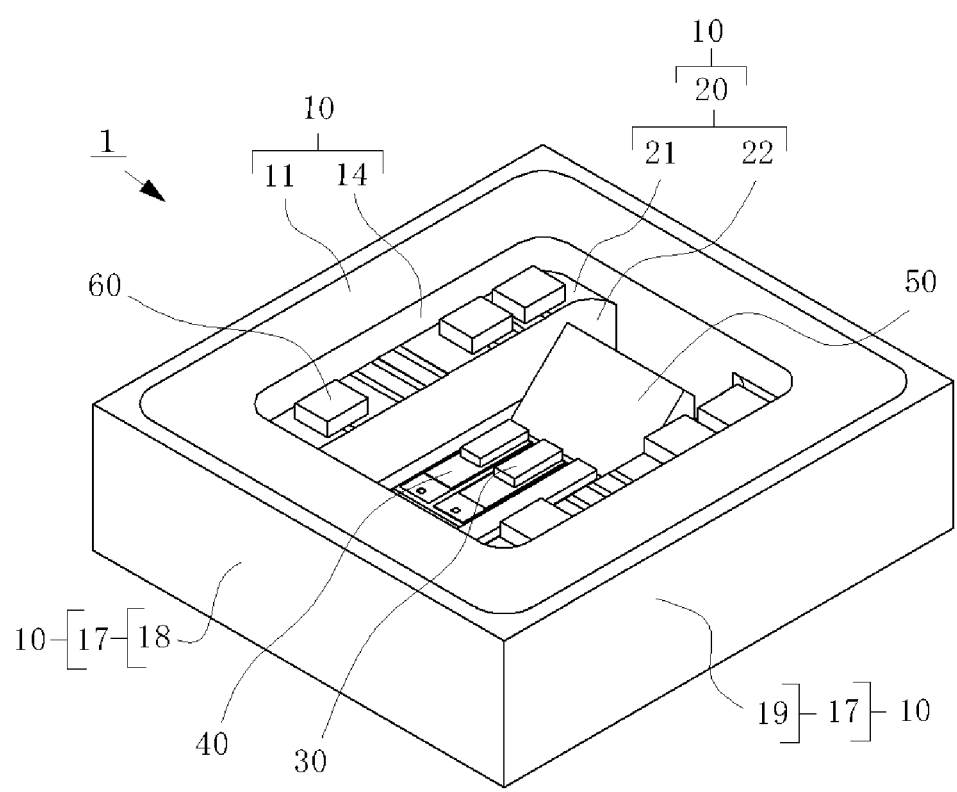
FIG. 3 is a perspective view for describing the inside configuration of the light emitting device according to the first embodiment.
Figure 4:
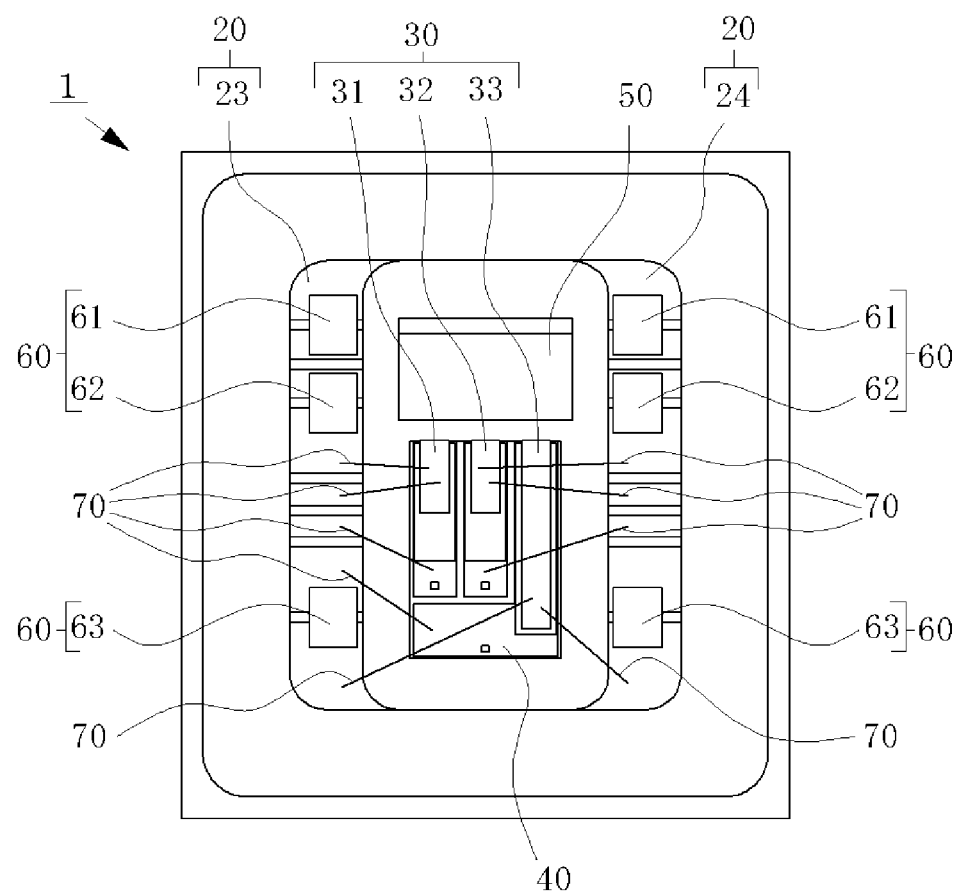
FIG. 4 is a top view for describing the inside configuration of the light emitting device according to the first embodiment.
Figure 5:
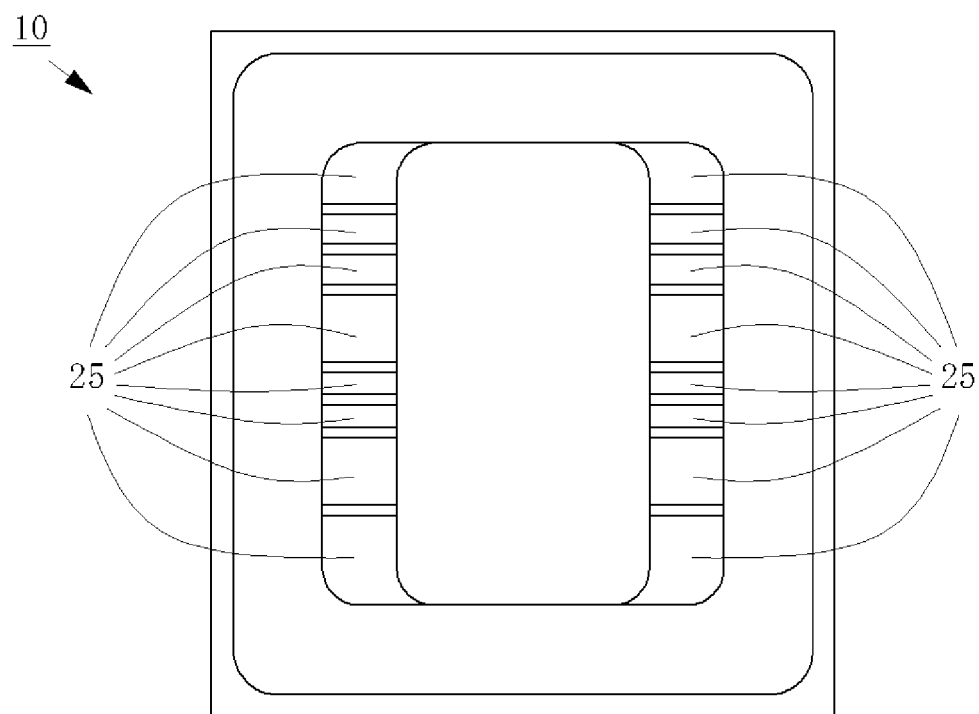
FIG. 5 is a top view of a base of the light emitting device according to the first embodiment.
Figure 6:
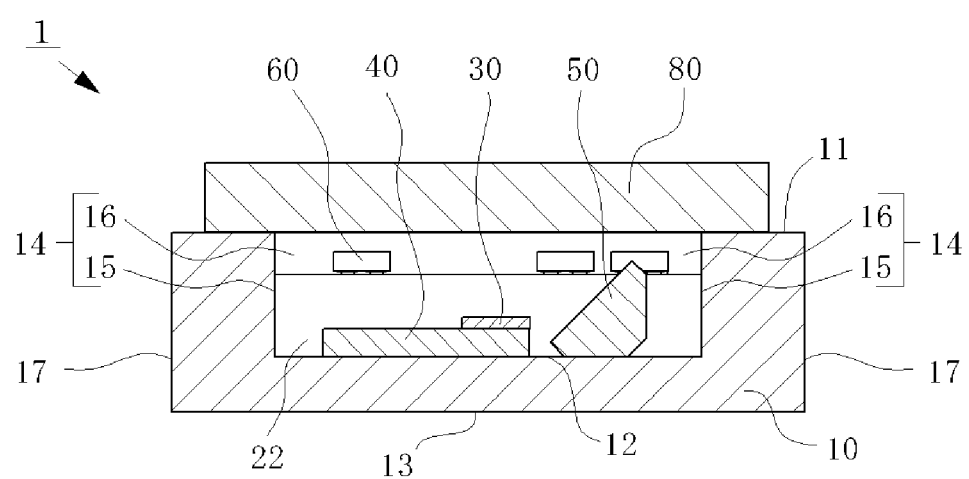
FIG. 6 is a cross-sectional view of the light emitting device taken along line VI-VI in FIG. 2.

FIG. 1 is a perspective view of a light emitting device 1 according to a first embodiment. FIG. 2 is a top view of the light emitting device 1 shown in FIG. 1. FIG. 3 is a perspective view for describing the inside configuration of the light emitting device 1, excluding a lid member 80. FIG. 4 is a top view of the light emitting device 1 shown in FIG. 3. FIG. 5 is a top view of just a base 10 of the light emitting device 1. FIG. 6 is a cross-sectional view of the light emitting device 1 taken along line VI-VI in FIG. 2.

The light emitting device 1 includes, as its components, a base 10, three semiconductor laser elements 30, a submount 40, a light-reflective member 50, six protective elements 60, nine wires 70, and a lid member 80.

The outer shape of the base 10 is rectangular as seen in a top view. The base 10 has a concave shape with a recess inside the outer shape. That is, a recess part that is recessed from an upper surface toward a lower surface is formed in the base 10. The base 10 includes the upper surface 11, a bottom surface 12, the lower surface 13, inner lateral surfaces 14, and outer lateral surfaces 17. The base 10 forms, in the recess, step parts 20 (the step part and the additional step part) each consisting of an upper surface and a lateral surface. The upper surface of each step part 20 is referred to as a step-part upper surface 21, and the lateral surface of each step part 20 is referred to as a step-part lateral surface 22.

The upper surface 11 intersects with the outer lateral surfaces 17 and the inner lateral surfaces 14, and the lower surface 13 intersects with the outer lateral surfaces 17. The bottom surface 12 is positioned above the lower surface 13 and lower than the upper surface 11. In the regions where the step parts 20 are formed, the step-part lateral surfaces 22 intersect with the bottom surface 12, and the step-part upper surfaces 21 intersect with the inner lateral surfaces 14. In the region where the step parts 20 are not formed, the bottom surface 12 intersects with the inner lateral surfaces 14.

As seen in a top view, the recess part forms space by the recess inside the frame defined by the upper surface 11 of the base 10. The outer shape of the frame is rectangular as seen in a top view. The step parts 20 are formed inner than (inside of) the frame. The step parts 20 are respectively provided along two inner lateral surfaces 14 which are the opposite two sides of the rectangular outer shape. Along the entire length of the inner lateral surfaces 14 of the two sides, the step parts 20 are respectively provided to intersect with the inner lateral surfaces 14 of the two sides. The inner lateral surfaces 14 of other two sides are not provided with the step parts 20 excluding the intersecting portions.

Here, the intersecting portion refers to the portion where two surfaces intersect with each other by their ends. The inner lateral surfaces 14 not provided with the step parts 20 excluding the intersecting portions are referred to as the first inner lateral surfaces 15. The base 10 has a pair of first inner lateral surfaces facing each other. The inner lateral surfaces 14 provided with the step parts 20 are referred to as the second inner lateral surfaces 16 (the second inner lateral surface and the additional second inner lateral surface). The base 10 has a pair of second inner lateral surfaces facing each other. Similarly, the outer lateral surfaces 17 corresponding to the first inner lateral surfaces are referred to as the first outer lateral surfaces 18. The outer lateral surfaces 17 corresponding to the second inner lateral surfaces are referred to as the second outer lateral surfaces 19. In distinguishing between two step parts 20 respectively formed along two pieces of the inner lateral surfaces, they are referred to as the first step part and the second step part.

The second inner lateral surface 16 extends along a plane intersecting with a plane along which the one of the first inner lateral surfaces 15 extends. The additional second inner lateral surface 16 extends along a plane intersecting with a plane along which the one of the first inner lateral surfaces 15 extends. Width of the upper surface 11 from outer lateral surfaces 17 to inner lateral surfaces 14 is identical excluding the intersecting portions. As used herein, the identical width permits a difference of 10%. As seen in a top view, in the distance from the outer lateral surfaces 17 to the bottom surface 12, the second outer lateral surfaces 19 are greater than the first outer lateral surfaces 18 by the step parts 20. In this structure, the base 10 is less prone to warp in the manufacturing process in the direction of the second outer lateral surfaces 19 than in the direction of the first outer lateral surfaces 18.

In the base 10, the sides corresponding to the second inner lateral surfaces 16 are longer than the sides corresponding to the first inner lateral surfaces 15. The sides corresponding to the second outer lateral surfaces 19 are longer than the sides corresponding to the first outer lateral surfaces 18. Taking into consideration of the deformation of the base 10 due to warp, the sides corresponding to the first inner lateral surfaces 15 or the first outer lateral surfaces 18 are preferably shorter than the sides corresponding to the second inner lateral surfaces 16 or the second outer lateral surfaces 19 which are less prone to warp. Note that, the sides may be identical to one another in length or the relationship in length between them may be inverted.

The main material of the base 10 may be ceramic. Ceramic used for the base 10 may be, for example, aluminum nitride, silicon nitride, aluminum oxide, or silicon carbide.

A plurality of metal films 25 is respectively provided on the lower surface 13 of the base 10 and the step-part upper surfaces 21. The metal film 25 provided on the lower surface 13 of the base 10 and the metal film 25 provided on the step-part upper surfaces 21 are connected to each other via metal passing inside the base 10 and, therefore, can be electrically connected to each other.

A plurality of metal films 25 is provided at each of the step-part upper surfaces 21 of the first step part 23 and that of the second step part 24. The plurality of metal films 25 is symmetrically disposed between the first step part 23 and the second step part 24 so as to oppose to each other. Note that, the metal films 25 are not necessarily disposed to have symmetry between the first step part 23 and the second step part 24.

In the step-part upper surface 21 of the step part 20 corresponding to one second inner lateral surface 16, the plurality of metal films 25 is provided in sequence from one end to other end of the side corresponding to the second inner lateral surface 16. That is, a line parallel to this side intersects with all the metal films 25 provided on the step-part upper surface 21 corresponding to one second inner lateral surface 16. Furthermore, a line perpendicular to this side intersects with only one of the metal films 25 provided on the step-part upper surface 21 corresponding to one second inner lateral surface 16.

In the base 10, a bottom part, which includes the bottom surface 12, and a frame part, which forms the frame surrounding the bottom part and includes the inner lateral surfaces 14 and the step parts 20, may be formed of different main materials, and the base 10 may be formed having the frame part and the bottom part joined to each other. In this case, for example, the main material of the frame part may be ceramic, and the main material of the bottom part may be metal which is higher in thermal conductivity than the ceramic of the frame part.

The outer shape of each semiconductor laser element 30 is rectangular as seen in a top view. A lateral surface intersecting with one of two short sides of this rectangle functions as the emitting end surface for light emitted from the semiconductor laser element 30. The upper surface and the lower surface of the semiconductor laser element 30 are greater in area than the emitting end surface.

The three semiconductor laser elements 30 are each a multiple-emitter element including two emitters. At the lower surface of the semiconductor laser element 30, one electrode surface shared by the two emitters is provided. At the upper surface of the semiconductor laser element 30, two electrode surfaces respectively corresponding to two emitters are provided.

Laser light emitted from each emitter spreads, and forms an oval far-field pattern (hereinafter referred to as "the FFP") in a plane parallel to the light emitting end surface. The FFP is the shape of emitted light or light intensity distribution at a position spaced apart from the emitting end surface. Light of which light intensity distribution has an intensity of $1/e^2$ or more to the peak intensity value is referred to as the main portion of the light.

The three semiconductor laser elements 30 consist of a semiconductor laser element emitting blue-color light, a semiconductor laser element emitting green-color light, and a semiconductor laser element emitting red-color light. As necessary, the three semiconductor laser elements are distinguished from one another by being referred to as a first semiconductor laser element, a second semiconductor laser element, and a third semiconductor laser element.

For example, in the embodiment shown in FIG. 3, the three semiconductor laser elements 30 consist of a first semiconductor laser element 31 emitting blue-color light, a second semiconductor laser element 32 emitting green-color light, and a third semiconductor laser element 33 emitting red-color light.

As used herein, the blue-color light refers to light of which peak emission wavelength falls within a range of 420 nm to 494 nm inclusive. The green-color light refers to light of which peak emission wavelength falls within a range of 495 nm to 570 nm inclusive. The red-color light refers to light of which peak emission wavelength falls within a range of 605 nm to 750 nm inclusive.

As seen in a top view, the outer shape of the first semiconductor laser element 31 and the outer shape of the second semiconductor laser element 32 are identical to each other in the length of the long side of the rectangular shape. As used herein, the identical length permits a difference of 20%. As seen in a top view, the outer shape of the third semiconductor laser element 33 is greater in the length of the long side of the rectangle shape than that of the first semiconductor laser element 31 and that of the second semiconductor laser element 32. Specifically, the long side of the third semiconductor laser element 33 is longer by 20% or more than the longer one of the long side of the first semiconductor laser element 31 and the long side of the second semiconductor laser element 32.

Note that, the semiconductor laser elements 30 may each be a single-emitter element including only one emitter. The semiconductor laser elements 30 may include both of a single-emitter element and a multiple-emitter element. The number of the plurality of semiconductor laser elements is not limited to three. The light emitted by the semiconductor laser elements 30 is not specified to those described above. The semiconductor laser elements 30 emitting light of an identical color may be disposed.

The terms "first" to "third" distinguishing the three semiconductor laser elements 30 may refer to different target semiconductor laser elements than those used above. For example, the semiconductor laser element emitting red-color light may be referred to as the first semiconductor laser element; the semiconductor laser element emitting blue-color light may be referred to as the second semiconductor laser element; and the semiconductor laser element emitting green-color light may be referred to as the third semiconductor laser element.

For example, the semiconductor laser element having a rectangular outer shape as seen in a top view of which long side is great may be referred to as the first semiconductor laser element, and the semiconductor laser element of which short side is small may be referred to as the second semiconductor laser element. The terms "first", "second" and the like are merely signs used for distinction, and may be used as appropriate according to the intent of distinction.

The submount 40 is rectangular prism-shaped. In the submount 40, the sides in the height direction are the smallest. The submount 40 is formed of, for example, silicon nitride, aluminum nitride, or silicon carbide. Without being specified thereto, other materials may be used. The metal film 25 is provided at the upper surface of the submount 40.

The light-reflective member 50 includes a lower surface and a light-reflective surface which is inclined relative to the lower surface. The light-reflective surface is flat, and designed to form an angle of 45 degrees relative to the lower surface of the light-reflective member 50. This angle is not specified to 45 degrees. The light-reflective surface may be a curved surface.

The main material of the light-reflective member 50 may be glass, metal or the like. The main material is preferably heat resistant, and may be, for example, quartz or glass such as BK7 (borosilicate glass), metal such as Al, or Si. As the light-reflective surface, a dielectric multilayer film of metal such as Ag, Al or the like or $Ta_2O_5/SiO_2$, $TiO_2/SiO_2$, $Nb_2O_5/SiO_2$ or the like may be employed.

The light-reflective surface may have a light reflectivity of 99% or more to the peak wavelength of laser light irradiated to the light-reflective surface. The light reflectivity may be 100% or less or less than 100%. The protective elements 60 are provided to avoid overcurrent for specific elements (for example, the semiconductor laser elements 30). The protective elements 60 may be, for example, Zener diodes. The Zener diodes may be formed of Si. The wires 70 are, for example, metal wires.

The lid member 80 is formed to have a rectangular prism shape. In the lid member 80, sides in height direction are the shortest. The main material of the lid member 80 is a light-transmissive material. The main material may be, for example, sapphire. Sapphire is relatively high in refractive index and also in strength. At the peripheral region of the lower surface of the lid member 80, a metal film for bonding is provided.

The lid member 80 may have an opaque region at part of the upper surface or the lower surface. For example, a region highly reflective or light-shielding may be partially provided. The shape is not specified to a rectangular prism. The main material of the lid member 80 may be glass or the like.

Next, a description will be given of the light emitting device 11 made up of the above-described elements.

Firstly, the protective elements 60 are disposed on the step-part upper surfaces 21. For example, when the protective elements are formed of Si, the base 10 is preferably formed of ceramic than resin in view of bondability, because the difference in coefficient of linear expansion between the ceramic base 10 and the protective elements is smaller.

One protective element 60 corresponds to one emitter of the semiconductor laser element 30. That is, for one semiconductor laser element 30 including two emitters, two protective elements 60 are provided. In this manner, inner the frame of the light emitting device 1, the protective elements 60 are provided in a number greater than the semiconductor laser elements 30. Provision of at least one protective element on the step-part upper surface 21 contributes to downsizing the light emitting device 1.

Each of two protective elements 60 corresponding to one semiconductor laser element 30 are connected to two metal films 25 provided at the step-part upper surface 21, so that one of the two metal films 25 is electrically connected to the cathode electrode and the other of the two metal films 25 is electrically connected to the anode electrode.

Each protective element 60 is disposed across the metal film 25 of the cathode electrode and the metal film 25 of the anode electrode. In this manner, the protective element 60 is electrically connected without using a wire. Accordingly, the protective element 60 is electrically connected to two metal films 25 placed next to each other on the step-part upper surface 21.

Figure 7:
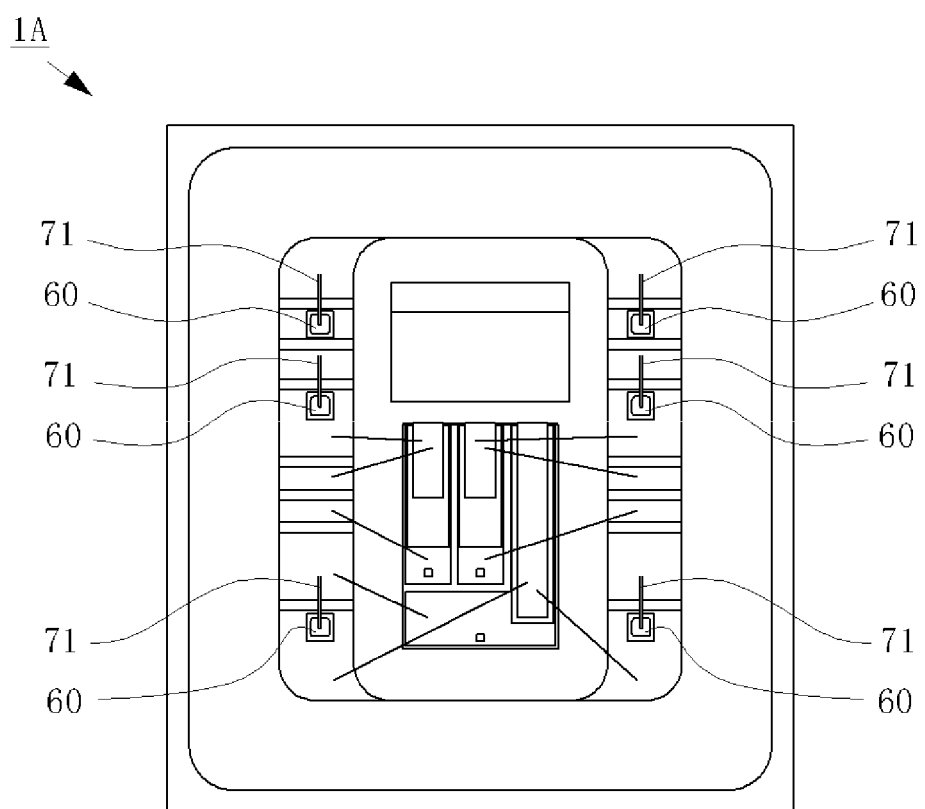
FIG. 7 is a top view of a light emitting device according to a modified example in which protective elements are connected with wires.

Instead of disposing each protective element 60 across two metal films 25, electrical connection may be established using wires 71. FIG. 7 shows a modified example of a light emitting device 1A in which a protective element 60 is disposed on one of two metal films 25 and a wire 71 connects between the protective element 60 and the other of the two metal film 25. In this case, the protective element 60 is previously disposed, and then the wire 71 is connected to the protective element 60 and the metal film 25. Note that, when this wire is to be distinguished from the wire 70 which is used for electrically connecting the semiconductor laser element 30, the wire 70 and the wire 71 are respectively referred to as a first wire and a second wire.

The protective elements 60 are disposed on the step-part upper surfaces 21 of the step parts 20 provided over the entire length of the sides corresponding to the second inner lateral surfaces 16 of the recess, in the vicinity of ends of the sides as seen in a top view. Here, in each of the first step part 23 and the second step part 24, two protective elements 60 are disposed in the vicinity of one end of the side, and one protective element 60 is disposed in the vicinity of the other end of the side. Each of the upper surface of the step part 20 and an upper surface of the additional step part 20 has at least one of the protective elements 60 arranged thereon. While the details will be given later, this disposition facilitates wire bonding of the semiconductor laser elements 30 in conjunction with the disposition relationship of the semiconductor laser elements 30 and the light-reflective member 50.

Next, three semiconductor laser elements 30 are disposed on the submount 40 so as to be juxtaposed to (aligned along) one another. The electrode surface at the lower surface of each of the three semiconductor laser elements 30 is bonded to the metal film provided on the upper surface of the submount 40. Beside the first semiconductor laser element 31, the second semiconductor laser element 32 is disposed. Beside the second semiconductor laser element 32, the third semiconductor laser element 33 is disposed.

That is, the first semiconductor laser element 31 and the second semiconductor laser element 32 are adjacent to each other, and the second semiconductor laser element 32 and the third semiconductor laser element 33 are adjacent to each other. The second semiconductor laser element 32 is interposed between the first semiconductor laser element 31 and the third semiconductor laser element 33. Note that, the third semiconductor laser element 33 may be disposed so as to be adjacent to the first semiconductor laser element 31 instead of the second semiconductor laser element 32.

The three semiconductor laser elements 30 are arranged such that their emitting end surfaces face one lateral surface of the submount 40. The emitting end surfaces are disposed at a plane identical to the lateral surface of the submount 40, or disposed outward than the lateral surface of the submount 40. This lateral surface of the submount 40 is referred to as the emitting-end-surface-side lateral surface. This disposition prevents the emitted light from being directly irradiated to the upper surface of the submount 40.

The submount 40 can also perform to dissipate heat generated by the semiconductor laser elements 30. Specifically, the submount 40 should be formed with a material being higher in thermal conductivity than the semiconductor laser elements 30. Accordingly, when the submount 40 exhibits this performance, the submount 40 can be regarded as a heat dissipating member. By the semiconductor laser elements being bonded to the submount 40 by their lower surfaces which are greater in area than their emitting end surfaces, heat dissipating property improves.

The light emitting position of the semiconductor laser elements 30 is increased by the submount 40 on which the semiconductor laser elements 30 are disposed. That is, the submount 40 raises the light emitting position higher, thereby performing to adjust the position of light emitted onto the light-reflective surface. Accordingly, the submount 40 can be regarded as the adjusting member. Note that, the submount 40 may be individually provided for each of the semiconductor laser elements 30.

Next, the submount 40 on which the semiconductor laser elements 30 are disposed is disposed on the bottom surface 12 of the base 10. The submount 40 is disposed on the bottom surface 12 inside the frame formed by the frame part of the base 10. The submount 40 is disposed on the bottom surface 12 inside the step parts 20 of the base 10.

The submount 40 is disposed such that the emitting end surface of the semiconductor laser element 30 opposes to the first inner lateral surface 15 of the base 10. The submount 40 is disposed such that the lateral surface of the semiconductor laser element 30 opposite to the emitting end surface opposes to the first inner lateral surface 15 opposite to the first inner lateral surface 15 to which the emitting end surfaces oppose. The submount 40 is disposed such that two lateral surfaces intersecting with the emitting end surface of each semiconductor laser element 30 opposes to the second inner lateral surface 16 of the base 10 or the lateral surface of the adjacent semiconductor laser element 30 intersecting with the emitting end surface.

Accordingly, the emitted light from the semiconductor laser elements 30 travels toward the first inner lateral surface 15. In particular, from every semiconductor laser element, if light emitted to the direction perpendicular to the emitting end surface (hereinafter referred to as light of the optical axis) traveled straight, the light of the optical axis would become incident on the first inner lateral surface 15. The emitting end surfaces and the first inner lateral surface 15 on which the light of the optical axis would become incident are parallel to each other. The second inner lateral surfaces 16 include a region which is parallel to the lateral surfaces which intersect with the emitting end surfaces. As used herein, being parallel permits a difference of ±5 degrees. This region may not necessarily be parallel. The first semiconductor laser element 31 is arranged closer to the first step part 23 than the second semiconductor laser element 32. The second semiconductor laser element 32 is arranged closer to the second step part 24 than the first semiconductor laser element 31. The third semiconductor laser element 33 is arranged closer to the second step part 24 than the second semiconductor laser element 32.

Next, the light-reflective member 50 is disposed on the bottom surface 12 of the base 10. The light-reflective member 50 reflects light emitted from all the three semiconductor laser elements 30 disposed on the bottom surface 12. Accordingly, the light-reflective member 50 is disposed such that the light-reflective surface of the light-reflective member 50 is oriented toward the emitting end surfaces. As seen in a top view, the sides corresponding to the upper edge and the lower edge of the inclination of the light-reflective surface and the emitting-end-surface-side lateral surface of the submount 40 become parallel to each other. The light of the optical axis is reflected at the light-reflective surface, whereby the light travels upward perpendicularly to the bottom surface 12. As used herein, being perpendicular permits a difference of ±5 degrees.

Note that, in place of a single light-reflective member 50 reflecting light from all the semiconductor laser elements 30, the light-reflective members 50 may be individually disposed for each of the semiconductor laser elements 30, to reflect light from corresponding semiconductor laser element.

In the state where the light-reflective member 50 and the submount 40 are disposed so as to reflect the emitted light from the semiconductor laser elements 30, in the smallest rectangular covering the light-reflective member 50 and the submount 40 as seen in a top view, a width perpendicular to the light emitting end surface is longer than a width parallel to the light emitting end surface. Accordingly, the submount 40 and the light-reflective member 50 are disposed in a compact manner for the light emitting device 1 of which side of the base 10 corresponding to the second inner lateral surface 16 is longer than side of the base 10 corresponding to the first inner lateral surface 15.

Here, a description will be given of the disposition relationship among the semiconductor laser elements 30, the submount 40, the light-reflective member 50, and the protective elements 60. In comparing the disposition relationship, being in the direction toward which light travels from the semiconductor laser elements 30 is referred to as being on the light traveling side, and being in the opposite direction is referred to as being on the element side. For example, when opposing first inner lateral surfaces 15 are compared with each other, the first inner lateral surface 15 in the direction of traveling light emitted from the semiconductor laser elements is regarded as the-light traveling side of the first inner lateral surface 15, and the first inner lateral surface 15 on the opposite side is regarded as the element-side of the first inner lateral surface 15.

The three protective elements 60 disposed on the step-part upper surface 21 of the step part 20 provided along one second inner lateral surface 16 are distinguished from one another by being referred to as the first protective element 61, the second protective element 62, and the third protective element 63 in sequence from the light traveling side to the element side.

The submount 40 is disposed, with respect to the direction parallel to the second inner lateral surface 16, so that the emitting end surfaces of the semiconductor laser elements 30 are positioned closer to one of the first inner lateral surfaces 15 on the light traveling side than a center position between the first inner lateral surfaces 15. That is, the distance from the emitting end surfaces of the semiconductor laser elements 30 to the light traveling side of the first inner lateral surface 15 is smaller than the distance from the center of opposing first inner lateral surfaces 15 to the light traveling side of the first inner lateral surface 15. Accordingly, the light emitting end surface of the semiconductor laser element 30 is disposed on the light traveling side than a center in the space in the recess.

The submount 40 is disposed, with respect to the direction parallel to the second inner lateral surface 16, so that the lateral surfaces of the semiconductor laser elements 30 opposite to the emitting end surfaces are positioned closer to the other of the first inner lateral surfaces 15 on the element side than the center position between the first inner lateral surfaces 15. This disposition relationship is similarly applied to all of the first semiconductor laser element 31, the second semiconductor laser element 32, and the third semiconductor laser element 33.

The submount 40 is disposed, with respect to the direction parallel to the second inner lateral surface 16, so that the emitting-end-surface-side lateral surface of the submount 40 is positioned closer to one of the first inner lateral surfaces 15 on the light traveling side than the center position between the first inner lateral surfaces 15. With respect to the direction parallel to the second inner lateral surfaces 16, the lateral surface of the submount 40 opposite to the emitting-end-surface-side lateral surface is positioned closer to the other of the first inner lateral surfaces 15 on the element side than the center position between the first inner lateral surfaces 15. Accordingly, the submount 40 is provided from the light traveling side to the element side with the center in the space in the recess as the boundary.

The submount 40 is disposed, with respect to the direction parallel to the second inner lateral surface 16, so that the barycenter of the submount 40 is positioned closer to the other of the first inner lateral surfaces 15 on the element side than the center position between the first inner lateral surfaces 15. Accordingly, as a whole, the submount 40 is provided shifted to the element side from the center in the space in the recess.

The submount 40 is disposed, with respect to the direction parallel to the second inner lateral surface 16 or the second outer lateral surface 19, so that the emitting end surfaces of the semiconductor laser elements 30 are positioned closer to one of the first outer lateral surfaces 18 on the light traveling side than a center position between the first outer lateral surfaces 18. Accordingly, the light emitting end surfaces of the semiconductor laser element 30 are provided shifted to the light traveling side from a center of the base 10 based on the outer shape of the base 10 or a center of the light emitting device 1 based on the outer shape of the light emitting device 1.

The submount 40 is disposed, with respect to the direction parallel to the second inner lateral surface 16 or the second outer lateral surface 19, so that the lateral surface of the semiconductor laser element 30 on the side opposite to the emitting end surface is positioned closer to the other of the first outer lateral surface 18 on the element side than the center position between the first outer lateral surfaces 18.

The submount 40 is disposed, with respect to the direction parallel to the second inner lateral surface 16 or the second outer lateral surface 19, so that the emitting-end-surface-side lateral surface of the submount 40 is positioned closer to one of the first outer lateral surfaces 18 on the light traveling side than the center position between the first outer lateral surfaces 18. The submount 40 is disposed, with respect to the direction parallel to the second inner lateral surface 16 or the second outer lateral surface 19, so that the lateral surface of the submount 40 on the side opposite to the emitting-end-surface-side lateral surface is positioned closer to the other of the first outer lateral surfaces 18 on the element side than the center position between the first outer lateral surfaces 18. Accordingly, the submount 40 is provided from the light traveling side to the element side with the center based on the outer shape of the base 10 or the outer shape of the light emitting device 1 as the boundary.

The submount 40 is disposed, with respect to the direction parallel to the second inner lateral surface 16 or the second outer lateral surface 19, so that the barycenter of the submount 40 is positioned closer to the other of the first outer lateral surfaces 18 on the element side than the center position between the first outer lateral surfaces 18. Accordingly, as a whole, the submount 40 is provided shifted to the element side from the center according to the outer shape of the base 10 or the outer shape of the light emitting device 1.

The light-reflective member 50 is disposed so as to be included in the region on the light traveling side than a plane passing through the center of the opposing first inner lateral surfaces 15 and parallel to the first inner lateral surfaces 15. The light-reflective member 50 is disposed so as to be included in the region on the light traveling side than a plane passing through the center of the opposing first outer lateral surfaces 18 and parallel to the first inner lateral surfaces 15 or the first outer lateral surfaces 18. With reference to the direction parallel to the second inner lateral surfaces 16, the light-reflective member 50 is shorter than the submount 40.

In relation to the semiconductor laser element 30, the first protective element 61 is disposed on the light traveling side than a plane including the emitting end surface of any one of the three semiconductor laser elements 30. The first protective element 61 is disposed on the upper surface of the step part 20 and on the light traveling side of the laser light from any one of the three semiconductor laser elements 30 with respect to a plane including an emitting end surface of the one of the three semiconductor laser elements 30. In relation to the submount 40, the first protective element 61 is disposed on the light traveling side than a plane including the emitting-end-surface-side lateral surface of the submount 40. In relation to the light-reflective member 50, as seen in a top view, the first protective element 61 is disposed on the light traveling side than a line including the side being the lower edge of the light-reflective surface. As seen in a top view, the first protective element 61 intersects with a line including the side being the upper edge of the light-reflective surface. Note that, the first protective element 61 may be disposed on the element side than this line.

In relation to the semiconductor laser element 30, the second protective element 62 is disposed on the light traveling side than the plane including the emitting end surface of any one of the three semiconductor laser elements 30. The second protective element 62 is disposed on the upper surface of the step part 20 and on the light traveling side of the laser light from any one of the three semiconductor laser elements 30 with respect to a plane including an emitting end surface of the one of the three semiconductor laser elements 30. In relation to the submount 40, the second protective element 62 is disposed on the light traveling side than the plane including the emitting-end-surface-side lateral surface of the submount 40. In relation to the light-reflective member 50, as seen in a top view, the second protective element 62 intersects with the line including the side being the lower edge of the light-reflective surface. As seen in a top view, the second protective element 62 is disposed on the element side than the line including the upper edge of the light-reflective surface. Note that, the second protective element 62 may be disposed so as to intersect with the plane including the emitting end surface of at least one of the semiconductor laser elements 30.

In relation to the semiconductor laser elements 30, the third protective element 63 is disposed on the element side than the plane including the emitting end surface of any one of the three semiconductor laser elements 30. In relation to the submount 40, the third protective element 63 is disposed on the element side than the plane including the emitting-end-surface-side lateral surface of the submount 40. The third protective element 63 is disposed on the light traveling side than a plane including the lateral surface opposite to the emitting-end-surface-side lateral surface. In relation to the light-reflective member 50, as seen in a top view, the third protective element 63 is disposed on the element side than the line including the side being the lower edge of the light-reflective surface. Note that, the third protective element 63 may be disposed so as to intersect with the plane including the lateral surface opposite to the emitting-end-surface-side lateral surface.

The thickness of the submount 40 from the lower surface to the upper surface is greater than the height from the bottom surface 12 to the side being the lower edge of the light-reflective surface. The height from the bottom surface 12 to the step-part upper surface 21 is greater than the height from the bottom surface 12 to the upper surface of the semiconductor laser element 30. Accordingly, the light emitting position in the emitting end surface of the semiconductor laser element 30 is higher than the lower edge of the light-reflective surface; higher than the upper surface of the submount 40; and lower than the step-part upper surfaces 21. The height from the bottom surface 12 to the top of the light-reflective member 50 is greater than the height from the bottom surface 12 to the step-part upper surfaces 21.

Next, in order to electrically connect the semiconductor laser elements 30, a plurality of wires 70 is bonded. Each wire 70 has one end bonded to the upper surface of corresponding semiconductor laser element 30 or the upper surface of the submount 40, and has the other end bonded to corresponding step-part upper surface 21. In the present embodiment, the electrode surfaces respectively corresponding to two emitters are provided at the upper surface. Therefore, one ends of corresponding two wires 70 are respectively bonded to the electrode surfaces of different emitters. One end of one wire 70 is bonded to the submount 40 electrically connected to the electrode surface of the lower surface of the semiconductor laser element 30.

In the present embodiment, three semiconductor laser elements 30 each including two emitters are provided, and the electric circuit is designed so as to control ON/OFF of light emission by one emitter. Accordingly, the semiconductor laser elements 30 are connected to wires so that power supply and voltage supply can be controlled for each emitter. In the light emitting device 1, nine wires 70 in total are bonded to any of the plurality of metal films 25. The nine wires are respectively bonded to different ones of the metal films 25, and establish electrical connection.

To one semiconductor laser element 30, three wires 70 are connected. One semiconductor laser element 30 is connected to one cathode electrode, and two emitters of one semiconductor laser element 30 are connected to different anode electrodes, respectively. One emitter and one protective element 60 are electrically connected in parallel. That is, the cathode electrode is provided for each semiconductor laser element 30, and the anode electrode is provided for each emitter of each semiconductor laser element 30. To one anode electrode, one protective element 60 is connected.

Note that, control may be exerted for each semiconductor laser element, that is, ON/OFF may be controlled by multiple emitters. In accordance with the control manner or the number of semiconductor laser elements, the number of the protective element or the wires is determined as appropriate. For example, when control is exerted for each semiconductor laser element, one protective element 60 and two wires 70 may correspond to one semiconductor laser element 30.

The three wires 70 electrically connected to the first semiconductor laser element 31 are bonded to the metal films 25 provided onto the step-part upper surface 21 of the first step part 23. The three wires 70 electrically connected to the second semiconductor laser element 32 are bonded to the metal films 25 provided onto the step-part upper surface 21 of the second step part 24. Accordingly, the three wires 70 electrically connected to the first semiconductor laser element 31 are bonded to the metal films 25 of one second inner lateral surface 16 side, and the three wires 70 electrically connected to the second semiconductor laser element 32 are bonded to the metal films 25 of the other second inner lateral surface 16 side.

All the wires 70 electrically connected to the first semiconductor laser element 31 are not bonded to the step-part upper surface 21 of the step part 20 (the second step part 24) formed along the second inner lateral surface 16 to which the second semiconductor laser element 32 is closer than the first semiconductor laser element 31 is. Similarly, all the wires 70 electrically connected to the second semiconductor laser element 32 are not bonded to the step-part upper surface 21 of the step part 20 (the first step part 23) formed along the second inner lateral surface 16 to which the first semiconductor laser element 31 is closer than the second semiconductor laser element 32 is. This configuration reduces the risk of the wires crossing each other and brought into contact with each other.

Out of the three wires 70 electrically connected to the third semiconductor laser element 33, one is bonded to the metal film 25 of one second inner lateral surface 16 side, and two are bonded to the metal films 25 of the other second inner lateral surface 16 side. That is, the wires 70 are arranged in a dispersed manner to the first step part 23 and the second step part 24.

All the wires 70 electrically connected to the third semiconductor laser element 33 are bonded to the third semiconductor laser element 33 in region projecting toward the element side than the first semiconductor laser element 31 and the second semiconductor laser element 32. That is, the third semiconductor laser element 33 is greater in the length of the long side than the first semiconductor laser element 31 and the second semiconductor laser element 32, and projects on the side opposite to the emitting end surface. In this projecting portion, the wires 70 have their one ends bonded to the upper surface electrode of the third semiconductor laser element 33.

A plurality of wires 70 of which one ends bonded to the semiconductor laser elements 30 or the submount 40 are bonded to the metal films 25 on the step parts 20 at the other ends. In relation to the semiconductor laser elements 30, the wires 70 are bonded on the element side than the plane including the emitting end surface of any one of the three semiconductor laser elements 30. In relation to the submount 40, the wires 70 are bonded on the element side than the plane including the emitting-end-surface-side lateral surface of the submount 40.

In relation to the light-reflective member 50, the plurality of wires 70 bonded to the semiconductor laser elements 30 or the submount 40 is not bonded on the light traveling side than the line including the side being the lower edge of the light-reflective surface as seen in a top view. These wires 70 are not bonded on the light traveling side than the line including the side being the upper edge of the light-reflective surface as seen in a top view. These wires 70 are arranged so as not to overlap with the light-reflective surface of the light-reflective member 50 as seen in a top view.

One ends of the wires 70 are bonded to the upper surface of the submount 40 or the upper surfaces of the semiconductor laser elements 30, and the other ends of the wires 70 are bonded to the step-part upper surfaces 21 at a position higher than the upper surface of the submount 40 and the upper surfaces of the semiconductor laser elements 30. Accordingly, if the wires 70 overlapped with the light-reflective surface as seen in a top view, portion of light reflected at the light-reflective surface might be incident on the wires 70. Accordingly, the wires 70 are desirably not on the optical path. To this end, as an example, the wires 70 may be bonded on the element side than a plane including the light emitting end surfaces. In the light emitting device 1, the wires 70 are bonded in such a manner. Note that, the step-part upper surfaces 21 may be at a lower position.

In order to bond the wires 70 in this manner, in the light emitting device 1, the protective elements 60 are disposed closer to the ends of the step-part upper surfaces 21 than the central region thereof. Specifically, the first protective element 61 and the second protective element 62 are provided shifted to the light traveling side, and the third protective element 63 is provided shifted to the element side. Disposing at least one protective element 60 in the region where bonding of the wires 70 is not desirable, efficient wiring pattern is realized.

One of the wires 70 electrically connected to the first semiconductor laser element 31 is bonded to the metal film 25 on which the protective element 60 is disposed. One of the wires 70 electrically connected to the second semiconductor laser element 32 is bonded to the metal film 25 where the protective element 60 is disposed. Specifically, these wires are bonded to the metal films 25 where the second protective elements 62 are disposed.

The three wires 70 electrically connected to the third semiconductor laser element 33 are bonded to the metal film 25 where the protective elements 60 are disposed. Two wires 70 corresponding to two emitters are bonded to the metal films 25 where the protective elements 60 are disposed. Specifically, the wires are bonded to the metal films 25 where the third protective elements 63 are disposed. That is, the plurality of metal films 25 includes the metal films 25 to which the protective elements 60 and the wires 70 are bonded.

The first protective element 61 and the second protective element 62, which are disposed on the step-part upper surface 21 of the step part 20 (the first step part 23) formed along the second inner lateral surface 16 on the side where the wires 70 electrically connected to the first semiconductor laser element 31 are bonded, protect the first semiconductor laser element 31. The first protective element 61 and the second protective element 62, which are disposed on the step-part upper surface 21 of the step part 20 (the second step part 24) formed along the second inner lateral surface 16 on the side where the wires 70 electrically connected to the second semiconductor laser element 32 are bonded, protect the second semiconductor laser element 32. Two third protective elements 63 disposed on the step-part upper surfaces 21 of the step parts 20 (the first step parts 23 and the second step part 24) formed along two second inner lateral surfaces 16 protect the third semiconductor laser element 33.

Between the first protective element 61 and the second protective element 62 disposed on the step-part upper surface 21 of one step part 20 (one of the first step part 23 and the second step part 24), no region for bonding the wire 70 bonded to the semiconductor laser element 30 is provided. Similarly, between these protective elements, no region for bonding the wire 70 bonded to the submount 40 is provided.

In the light emitting device 1 configured in this manner, a line being parallel to the first inner lateral surface 15 and intersecting with the light-reflective member 50 and the first protective elements 61 as seen in a top view can be drawn virtually. In other words, in the light emitting device 1, the light-reflective member 50 and at least one of first protective elements 61 are disposed so as to intersect with a line parallel to the first inner lateral surface 15. Disposing the first protective elements 61 at regions not desirable for bonding the wires 70 realizes a wiring patter which makes effective use of the step-part upper surfaces 21 and contributes to reducing the size.

Accordingly, in the light emitting device 1, one of the protective elements 60 disposed on the most light traveling side and the light-reflective member 50 are disposed so as to intersect with the line parallel to the first inner lateral surface 15. Alternatively, one of the protective elements 60 on the most light traveling side intersect with a line being parallel to the first inner lateral surfaces 15 and crossing at least any part in the light-reflective member 50. This configuration is common to each step parts 20 formed at the two second inner lateral surfaces 16.

In the light emitting device 1, as seen in a top view, a line being parallel to the first inner lateral surface 15 and intersecting with the light-reflective member 50 and the second protective elements 62 can be drawn virtually. In other words, in the light emitting device 1, the light-reflective member 50 and at least one of second protective elements 62 are disposed so as to intersect with a straight line which is a line parallel to the first inner lateral surface 15.

Accordingly, in the light emitting device 1, each of all the protective elements 60 disposed on the light traveling side than the center of the opposing first inner lateral surfaces 15 and the light-reflective member 50 are disposed so as to intersect with a line parallel to the first inner lateral surfaces 15. Alternatively, each of all the protective elements 60 disposed on the light traveling side than the center of the opposing first inner lateral surfaces 15 intersect with a line being parallel to the first inner lateral surfaces 15 and crossing at least any part in the light-reflective member 50. This configuration is common to each step parts 20 formed at the two second inner lateral surfaces 16.

In this manner, with reference to the disposition relationship of the light-reflective member 50, in the step parts 20 formed along the two second inner lateral surfaces 16, the regions not desirable for bonding the wires 70 have symmetry. A plurality of metal films provided on each of the step-part upper surfaces 21 are arranged symmetrically. Accordingly, the wiring pattern is realized making efficient use of the regions.

Next, the lid member 80 is bonded to the upper surface of the base 10. The metal films respectively provided at the bonding region of the lid member 80 and that of the base 10 are bonded to each other through Au—Sn or the like thereby fixed. Here, the base 10 and the lid member 80 are bonded to each other so that the space where the semiconductor laser elements 30 are disposed becomes hermetically sealed space. Such hermetic sealing avoids organic substances or the like from gathering at the light emitting end surfaces of the semiconductor laser elements 30.

The lid member 80 is also a light-transmissive member for transmitting light reflected at the light-reflective surface of the light-reflective member 50. Here, being light transmissive refers to exhibiting transmittance of 80% or more to light emitted from the semiconductor laser elements 30 and becoming incident on the light-transmissive member.

Thus, the light emitting device according to the present embodiment is designed to have a compact outer shape, while a plurality of semiconductor laser elements and a plurality of protective elements are disposed in the cavity of the base. In the base, the wiring patter is realized for such a compact design. Furthermore, by virtue of the elements being disposed taking into consideration of the optical path, the function as the light emitting device is sufficient.

In the foregoing, a description has been given of the light emitting device according to the embodiment. The light emitting device of the present disclosure is not strictly specified to the light emitting device according to the embodiment. That is, the present disclosure can be implemented without being specified to the outer shape or the structure of the light emitting device disclosed by the embodiment. Furthermore, in applying the present disclosure, not all the constituents are essential. For example, when part of the constituents of the light emitting device disclosed in the embodiment is not recited in the scope of claims, a person skilled in the art can replace, omit, deform, or change the material of the part of the constituents. Thus, flexibility in design as to such part is permitted, in conjunction with the inventive aspects recited in the scope of claims.

The light emitting device according to the embodiment is applicable to a head-mounted display, a projector, a vehicle headlight, illumination, a display and the like.

What is claimed is:
1. A light emitting device comprising:
a base having a bottom surface;
a frame part having
a pair of first inner lateral surfaces facing each other with the bottom surface being disposed therebetween in a first direction,
a pair of second inner lateral surfaces facing each other with the bottom surface being disposed therebetween in a second direction,
a first step-part formed along one of the pair of second inner lateral surfaces, and
a second step-part formed along the other of the pair of second inner lateral surfaces;
a plurality of semiconductor laser elements disposed on the bottom surface and configured to emit laser lights that travel toward one of the first inner lateral surfaces, the plurality of semiconductor laser elements including a first semiconductor laser element and a second semiconductor laser element;
one or more light-reflective members disposed on the bottom surface, and configured to reflect the laser lights emitted from the plurality of semiconductor laser elements; and
a plurality of wires respectively bonded to an upper surface of the first step-part or an upper surface of the second step-part to electrically connect the plurality of semiconductor laser elements to the frame part, wherein the first semiconductor laser element is disposed closer to the first step-part than the second semiconductor laser element, the second semiconductor laser element is disposed closer to the second step-part than the first semiconductor laser element, all of the wires that electrically connect the first semiconductor laser element to the frame part are not bonded to the upper surface of the second step-part, and all of the wires that electrically connect the second semiconductor laser element to the frame part are not bonded to the upper surface of the first step-part.

2. The light emitting device according to claim 1, wherein each of the wires that electrically connect the first semiconductor laser element to the frame part is bonded to the upper surface of the first step-part, and each of the wires that electrically connect the second semiconductor laser element to the frame part is bonded to the upper surface of the second step-part.

3. The light emitting device according to claim 1, wherein the laser light emitted from the first semiconductor laser element and the laser light emitted from the second semiconductor laser element have different colors.

4. The light emitting device according to claim 2, wherein the laser light emitted from the first semiconductor laser element and the laser light emitted from the second semiconductor laser element have different colors.

5. The light emitting device according to claim 1, wherein the laser light emitted from the first semiconductor laser element is one of blue-color light, green-color light, and red-color light, the laser light emitted from the second semiconductor laser element is one of blue-color light, green-color light, and red-color light, and the laser light emitted from the first semiconductor laser element and the laser light emitted from the second semiconductor laser element have different colors.

6. The light emitting device according to claim 2, wherein the laser light emitted from the first semiconductor laser element is one of blue-color light, green-color light, and red-color light, the laser light emitted from the second semiconductor laser element is one of blue-color light, green-color light, and red-color light, and the laser light emitted from the first semiconductor laser element and the laser light emitted from the second semiconductor laser element have different colors.

7. The light emitting device according to claim 1, wherein the laser light emitted from the first semiconductor laser element is blue-color light, and the laser light emitted from the second semiconductor laser element is green-color light.

8. The light emitting device according to claim 2, wherein the laser light emitted from the first semiconductor laser element is blue-color light, and the laser light emitted from the second semiconductor laser element is green-color light.

9. The light emitting device according to claim 1, wherein the plurality of semiconductor laser elements include two or more semiconductor laser elements configured to emit laser lights of the same color.

10. The light emitting device according to claim 2, wherein
the plurality of semiconductor laser elements include two or more semiconductor laser elements configured to emit laser lights of the same color.

11. The light emitting device according to claim 3, wherein
the plurality of semiconductor laser elements include two or more semiconductor laser elements configured to emit laser lights of the same color.

12. The light emitting device according to claim 4, wherein
the plurality of semiconductor laser elements include two or more semiconductor laser elements configured to emit laser lights of the same color.

13. The light emitting device according to claim 5, wherein
the plurality of semiconductor laser elements include two or more semiconductor laser elements configured to emit laser lights of the same color.

14. The light emitting device according to claim 6, wherein
the plurality of semiconductor laser elements include two or more semiconductor laser elements configured to emit laser lights of the same color.

15. The light emitting device according to claim 7, wherein
the plurality of semiconductor laser elements include two or more semiconductor laser elements configured to emit laser lights of the same color.

16. The light emitting device according to claim 8, wherein
the plurality of semiconductor laser elements include two or more semiconductor laser elements configured to emit laser lights of the same color.

17. The light emitting device according to claim 1, wherein
each of the pair of first inner lateral surfaces does not include a step-part formed along an entire length of a respective one of the pair of first inner lateral surfaces.

18. The light emitting device according to claim 1, further comprising
one or more submounts on which the plurality of the semiconductor laser elements are disposed.

19. The light emitting device according to claim 1, wherein
the plurality of semiconductor laser elements include a third semiconductor laser element, and the wires include a wire bonded to the upper surface of the first step-part to electrically connect the third semiconductor laser element to the frame part, and a wire bonded to the upper surface of the second step-part to electrically connect the third semiconductor laser element to the frame part.

* * * * *